United States Patent [19]
Malik et al.

[11] Patent Number: 6,027,853
[45] Date of Patent: Feb. 22, 2000

[54] PROCESS FOR PREPARING A RADIATION-SENSITIVE COMPOSITION

[75] Inventors: Sanjay Malik, Attleboro; Andrew J. Blakeney; Joseph J. Sizensky, both of Seekonk, all of Mass.

[73] Assignee: Olin Microelectronic Chemicals, Inc., Norwalk, Conn.

[21] Appl. No.: 09/008,671

[22] Filed: Jan. 16, 1998

[51] Int. Cl.[7] ................................................. G03G 1/73
[52] U.S. Cl. ..................... 430/270.1; 430/905; 210/656; 210/692; 528/482; 528/491; 528/502
[58] Field of Search ................................ 430/270.1, 905; 210/692, 656; 528/482, 491, 502 A

[56] References Cited

U.S. PATENT DOCUMENTS

| | | | |
|---|---|---|---|
| 4,812,551 | 3/1989 | Oi et al. | 528/129 |
| 4,921,778 | 5/1990 | Tackeray et al. | 430/326 |
| 5,098,574 | 3/1992 | Chambrette et al. | 210/651 |
| 5,171,767 | 12/1992 | Buckley et al. | 523/310 |
| 5,368,987 | 11/1994 | Hanamoto et al. | 430/270 |
| 5,462,675 | 10/1995 | Hopkins et al. | 210/767 |
| 5,527,161 | 6/1996 | Bailey et al. | 417/53 |
| 5,618,655 | 4/1997 | Davidson | 430/347 |
| 5,629,128 | 5/1997 | Shirakawa et al. | 430/192 |
| 5,667,932 | 9/1997 | Sato et al. | 430/192 |
| 5,674,662 | 10/1997 | Szmanda et al. | 430/270 |
| 5,731,123 | 3/1998 | Kawamura et al. | 430/176 |

*Primary Examiner*—John S. Chu
*Assistant Examiner*—Barbara Gilmore
*Attorney, Agent, or Firm*—Ohlandt, Greeley, Ruggiero & Perle

[57] ABSTRACT

The present invention relates to a process for preparing a radiation-sensitive composition, comprising the steps of (1) passing a solution of a crude polymer comprising a mixture of polymer chains having different molecular weights through a porous polymeric media having a predetermined molecular weight cut-off (MWCO) value, thereby separating the crude polymeric mixture into a first fraction comprising polymer chains having molecular weights above the MWCO value and a second fraction comprising polymer chains having molecular weights below the MWCO value; and (2) adding at least one fraction produced in the first step to at least one radiation-sensitive compound and at least one solvent to produce a radiation-sensitive composition.

21 Claims, 7 Drawing Sheets

PROCESS FOR PREPARING A RADIATION-SENSITIVE COMPOSITION

BACKGROUND OF THE INVENTION

1. Field of the Invention

The present invention relates to a process for preparing a radiation-sensitive composition containing a fractionated polymer, wherein the fractionated polymer is formed by passing a crude polymer mixture through a porous polymeric media. The present invention also relates to radiation-sensitive compositions containing fractionated polymers made by the above process.

2. Brief Description of Art

As integrated circuits (IC) devices become higher in memory density, photolithographic image patterns formed on wafers are required with less than 0.3 micron ($\mu$) in resolution. To achieve this objective, photoresists used for photolithographic imaging are required to have a higher resolution, faster sensitivity, and more vertical profile than the state-of-the-art photoresists of a decade ago.

Most common g/i-line positive working-type photoresists currently used in IC device manufacture consist of an alkaline-soluble polymer (e.g., novolak resin, polyhydroxystyrene resin, copolymers of hydroxystyrene and styrene/polyhydroxystyrene resin, and the like) as a binder resin, and a photoactive compound (PAC) such as a naphthoquinonediazide (DNQ) ester of a polyphenol compound. Preferred binder resins useful for the g/i-line applications, are selected from the group of novolak resins which are prepared by addition-condensation reaction of various phenolic derivatives with various aldehydes or ketones in the presence of acids such as oxalic acid, sulfuric acid, and the like. Among various phenolic derivatives used as a monomer of the novolak resins, meta-cresol and para-cresol are some of the most useful monomers. For example, combinations of novolak-type phenol resins and DNQ esters as a positive-working photoresist are disclosed in U.S. Pat. Nos. 5,547,814 and 5,407,779.

For high-resolution formulations, chemically amplified photoresists have been utilized instead of the novolak/DNQ combinations. These chemically amplified photoresists generally utilize a combination of a selected polymer resin such as a partially modified or protected poly(hydroxystyrene) resin or copolymer of a partially modified hydroxystyrene with other monomers such as acrylates or methacrylates, a photoacid generating compound (PAG), and a selected solvent.

For both novolak/DNQ and chemical amplified formulations, control of the structure of the polymer matrix of a photoresist is crucial for the superior lithographic properties which are required from modern integrated circuits. Conventionally, fractionation of polymers used in photoresists was carried out by dissolving the polymer in a known solvent and precipitating it with a calculated amount of a non-solvent. The fractionated polymer may then be isolated from the remaining solubilized polymers. However, this solvent fractionation process generates large amounts of solvent wastes that can be difficult to dispose of. The issue of solvent waste has been addressed by employing supercritical liquid carbon dioxide instead to fractionate these types of polymers. However, this approach has been hindered by high cost and unreliable scalability.

The above approaches also suffer additional disadvantages. Solubility of the polymers is dependent on a multitude of thermodynamic factors, notably temperature, and other physical parameters. Strict process control of these parameters is necessary to obtain fractionated polymers with the desired molecular weight range. Process control of this kind often requires complex, specialized equipment that adds to the cost of producing the products. Differential solubility approaches to polymer fractionation may result in a high degree of polydispersity of the fractionated polymers. Accordingly, in many cases, a better fractionation process is needed to produce a more homogeneous population of polymers (i.e., lower polydispersity) without the disadvantages of the prior art fractionation methods.

Thus, what is needed in the photoresist art is a reproducible, low-cost process of fractionating polymers for use in photoresists that results in substantially homogeneous polymers of a selected molecular weight. The present invention is believed to be an answer to that need.

Separately, Pall Corporation (East Hills, N.Y.) manufactures a series of ultrafiltration modules using membranes made from hollow fibers that are specifically designed for use in biotechnology and pharmaceutical industries. These ultrafiltration modules are designed to purify and concentrate diverse molecules such as protein-based pharmaceuticals, amino acids, antibiotics, low molecular weight products from fermented broths, and the like. However, such ultrafiltration modules or membranes have not been used to purify polymer resins for use in photoresists or other radiation-sensitive compositions used in semiconductor fabrication processes.

BRIEF SUMMARY OF THE INVENTION

In one aspect, the present invention relates to a process for preparing a radiation-sensitive composition, comprising the steps of: (1) passing a solution of a crude polymer comprising a mixture of polymer chains having different molecular weights through at least one porous polymeric media having a predetermined molecular weight cut-off (MWCO) value, thereby separating the crude polymeric mixture into a first fraction comprising polymer chains having molecular weights above the MWCO value and a second fraction comprising polymer chains having molecular weights below the MWCO value; and (2) adding at least one fraction produced in the first step to at least one radiation-sensitive compound and at least one solvent to produce a radiation-sensitive composition.

In another aspect, the present invention relates to a process for preparing a radiation-sensitive composition, comprising the steps of: (1) passing a solution of a crude polymer comprising a mixture of polymer chains having different molecular weights through a first porous polymeric media having a predetermined molecular weight cut-off (MWCO) value, thereby separating the crude polymeric mixture into a first fraction comprising polymer chains having molecular weights greater than the MWCO value and a second fraction comprising polymer chains having molecular weights less than the MWCO value; (2) passing the second fraction through a second porous polymeric media, the second porous polymeric media having a predetermined MWCO value that is less than the MWCO value of the first porous polymeric media, thereby separating the second fraction into a third fraction comprising polymer chains having molecular weights between the MWCO values, and a fourth fraction comprising polymer chains having molecular weights less than the MWCO value of the second polymeric media; and (3) adding the third fraction to at least one radiation-sensitive compound and at least one solvent to produce a radiation-sensitive composition.

In another aspect, the present invention relates to a process for preparing a radiation-sensitive composition, comprising the steps of: (1) passing a solution of a crude polymer comprising a mixture of polymer chains having different molecular weights through a first porous polymeric media having a predetermined molecular weight cut-off (MWCO) value, thereby separating the crude polymeric mixture into a first fraction comprising polymer chains having molecular weights greater than the first MWCO value and a second fraction comprising polymer chains having molecular weights less than the MWCO value; (2) passing the first fraction through a second porous polymeric media, the second porous polymeric media having a predetermined MWCO value that is greater than the MWCO value of the first porous polymeric media, thereby separating the first fraction into a third fraction comprising polymer chains having molecular weights greater than the MWCO value of the second polymeric media, and a fourth fraction comprising polymer chains having molecular weights between the MWCO values; and (3) adding the fourth fraction to at least one radiation-sensitive compound and at least one solvent to produce a radiation-sensitive composition.

Depending upon the molecular composition of the original crude polymer mixture and the required molecular weight and polydispersity of the target polymer, the solution of the crude polymer may be passed through more than two porous polymeric media, each having different MWCO values.

The invention also relates to positive-working photoresist compositions containing the fractionated polymers made from the above processes.

These and other aspects will become apparent upon reading the following detailed description of the invention.

BRIEF DESCRIPTION OF THE DRAWINGS

The invention will be more fully understood from the following detailed description taken in conjunction with the accompanying drawings in which.

DETAILED DESCRIPTION OF THE PREFERRED EMBODIMENTS

Figure 1:
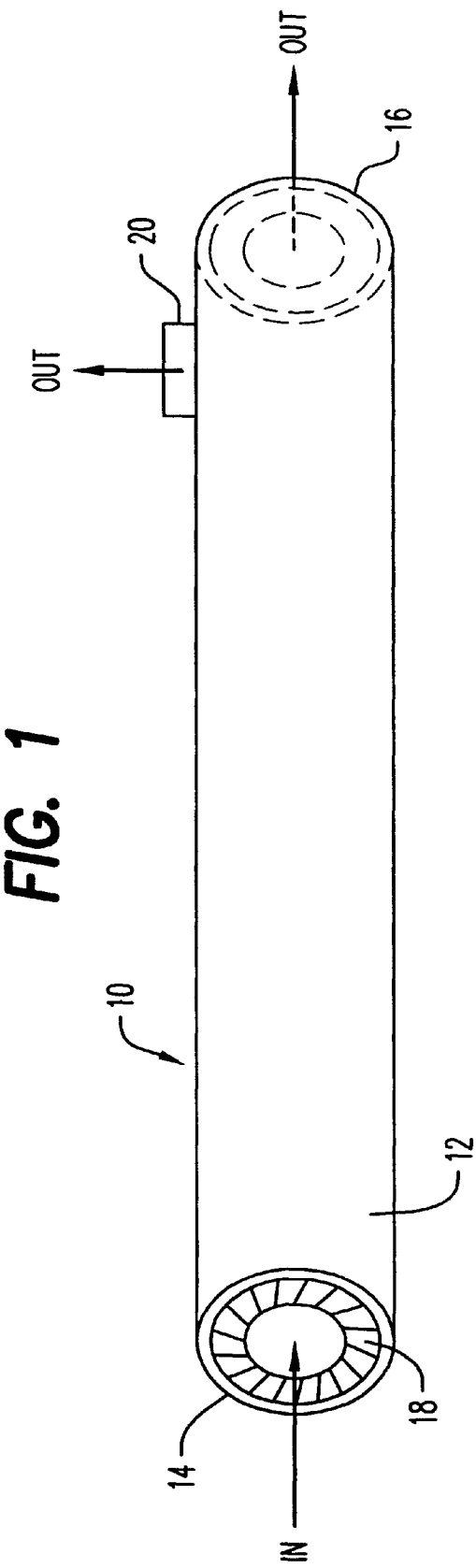
FIG. 1 is schematic view of a preferred fractionation apparatus useful in the process of the present invention.

The invention is directed to a process for preparing a radiation-sensitive composition containing a fractionated polymer, wherein the fractionated polymer is formed by passing a crude polymer mixture through at least one porous polymeric media. Generally, the process involves passing a solution of a crude polymer mixture through at least one porous polymeric media having a predetermined molecular weight cut-off (MWCO) value to isolate polymer chains having a desired molecular weight range. These isolated polymers are then added to at least one radiation-sensitive compound and at least one solvent to produce a radiation-sensitive composition.

As defined herein, the term "radiation-sensitive composition" refers to compositions used in the manufacture of photoresists that utilize a radiation-sensitive compound, such as a photoacid generating compound (PAG), or a photoactive compound (PAC). As defined herein, the term "crude polymer mixture" refers to any polymer or resin mixture useful in the production of photoresists. Polymers useful in the process of the invention include novolak polymers, polymers and copolymers based on polyhydroxystyrene (e.g., copolymers of styrene/hydroxystyrene), fully or partially protected hydroxystyrene-based polymers, or copolymers of hydroxystyrene with acrylates or methacrylates or other monomeric species. The phrase "fully or partially protected hydroxystyrene polymers" refers to polymers containing either unsubstituted or substituted hydroxystyrene monomeric repeating units where all or some of the hydroxyl groups on those repeating units have been replaced with acid-labile protecting groups (e.g., acetal groups, ketal groups and the like).

Resins particularly useful in the process of the invention include novolak resins such as phenol-formaldehyde novolak resins, cresol-formaldehyde novolak resins, xylenol-formaldehyde novolak resins, cresol-xylenol-formaldehyde novolak resins, and combinations thereof. Generally, novolak resins are prepared by the addition-condensation polymerization of phenolic monomer or monomers (e.g., phenol, cresols, xylenols, or mixtures thereof) with an aldehyde source such as formaldehyde. Illustrative preparations of novolak resins are disclosed in U.S. Pat. Nos. 4,377,631; 4,529,682; and 4,587,196, all of which issued to Toukhy and are incorporated herein by reference in their entireties.

Novolak resins are generally produced as a population of polymers having molecular weights in the range of about 500 to about 40,000 daltons. One preferred class of novolak resins is formed by the addition-condensation polymerization between a mixture of m- and p-cresols with formaldehyde having a molecular weight of about 1,000 to 10,000 daltons.

Other resins suitable in the process of the present invention include polymers and copolymers based on polyhydroxystyrene, fully or partially protected hydroxystyrene-based polymers, or copolymers of hydroxystyrene-based with other monomers (e.g., acrylates and methacrylates). Generally, these resins also have molecular weights in the range from about 500 to about 40,000 daltons.

The crude polymer mixtures that are passed through the porous polymeric media according to the process of the invention are preferably solutions of the polymers that are dissolved in a selected solvent or selected solvent mixture. Examples of suitable dissolving solvents include aliphatic alcohols (e.g., ethanol), ketones, aldehydes, ethers, esters, and the like. Solvents commonly used in photoresist compositions, such as ethyl lactate (EL), ethyl 3-ethoxypropionate (EEP), methyl 3-methoxypropionate (MMP), propylene glycol methyl ether acetate (PGMEA), and combinations thereof, are preferably used.

Generally, the concentration of the polymers in the solvent ranges from about 5 wt % to about 75 wt %, more preferably from about 7 wt % to about 50 wt %, and most preferably from about 10 wt % to about 30 wt %, all based on the total weight of the polymer solution. A particularly useful concentration of polymers is about 10 wt %.

As indicated above, the crude solution of polymers used in photoresist compositions generally include polymers having molecular weights ranging from about 500 to about 40,000 daltons. According to the process of the invention, polymers having specific molecular weight ranges are isolated by passing the crude polymer mixture through a porous polymeric media that separates the polymers on the basis of molecular weight. Generally, the porous polymeric media is selected to separate polymers having less than a selected molecular weight into one fraction, and polymers having molecular weights greater than the selected molecular weight in a second fraction. The porous polymeric media preferably possesses a characteristic pore size that defines its specific molecular weight cut-off (MWCO) value. The MWCO generally corresponds to a specific polymer molecular weight (e.g., 3,000 daltons) in which polymers having that particular molecular weight or less are permitted to pass through the media. Polymers having molecular weights greater than the MWCO, however, do not permeate through the media due to the pore size restriction. Thus, polymers above and below the MWCO may be separated into two fractions.

The porous polymeric media may be made from any material known in the molecular separation art that is capable of separating polymers in the desired molecular weight range. However, the media must be compatible with the solvents used to make the polymer solutions and also used to transport the polymer solution through the media. Preferred materials for the porous polymeric media, in accordance with the method of the invention, include packed polyacrylonitrile and polysulfone. The porous polymeric media may take any shape including beads, sheets, membranes, discs, fibrils or lamellas. The effective area of the fractionation media varies depending on the size of the fractionation apparatus and the scale of the fractionation, generally from 100 cm$^2$ to 10 m$^2$.

FIG. 1 is a schematic diagram of a preferred fractionation apparatus that contains the porous polymeric media useful in the process of the present invention. As shown in FIG. 1, the preferred fractionation apparatus 10 of the invention includes a generally tubular housing 12, an inlet 14, and a primary outlet 16. The housing 10 may be made from any inert material that does not react with the solvents or polymers of the present invention. A particularly suitable material for the housing 10 is stainless steel.

A flowpath is defined within the apparatus 10 between the inlet 14 and the primary outlet 16 wherein the solution of crude polymer mixture flows through the fractionation apparatus. A porous polymeric fractionation media 18 selected from one or more of the materials recited above, is positioned concentrically inside the housing 12 and parallel with the flow path. A secondary outlet 20 is positioned on the housing adjacent to the primary outlet 16. Several suitable fractionation apparatuses are available commercially from the Pall Corporation (East Hills, N.Y.) under the names SEP00013, SIP0013, SLP0053, SEP3013, SIP 3013, and SLP 3053.

During the process of the present invention, solutions of crude polymers flow into the fractionation apparatus 10 through the inlet 14 and along the flowpath. As the solution progresses through the fractionation apparatus 10, polymers having molecular weights above the MWCO of the porous polymeric fractionation media 18 traverse the apparatus along the flowpath and flow out the outlet 16 as the high molecular weight retentate fraction. Polymers having molecular weights below the MWCO of the porous polymeric fractionation media 18, however, segregate from the crude polymer mixture by permeating out of the fractionation media. These segregated polymers flow out the secondary outlet 20 as the low molecular weight fraction. The low molecular weight fraction collected from the secondary outlet 20 or the high molecular weight retentate fraction collected from the outlet 16 may be used directly in the production of photoresist component solutions. Alternatively, the solvent may be stripped from the fractionated polymer solution and the isolated polymer can be then mixed in the appropriate photoresist solvent.

The crude polymer mixture may move along the flowpath by means of one or more pumps, gravity, or other transport means known in the art. Preferably, the crude polymer mixture moves through the fractionation apparatus by means of one or more pumps, for example peristaltic pumps, centrifugal pumps, or other pumps known in the art. Generally, the operating conditions of the fractionation apparatus are based on the scale of the fractionation, the concentration and/or viscosity of the crude solution of polymers, the solvent selected, and other processing parameters which are well known to the skilled artisan. When membranes are used as the fractionation media, typical operating trans-membrane pressures range from 10 psig to 25 psig. Times taken for the fractionation process are correlated to flow rates and range generally from about 5 minutes to about 20 hours.

Figure 2:
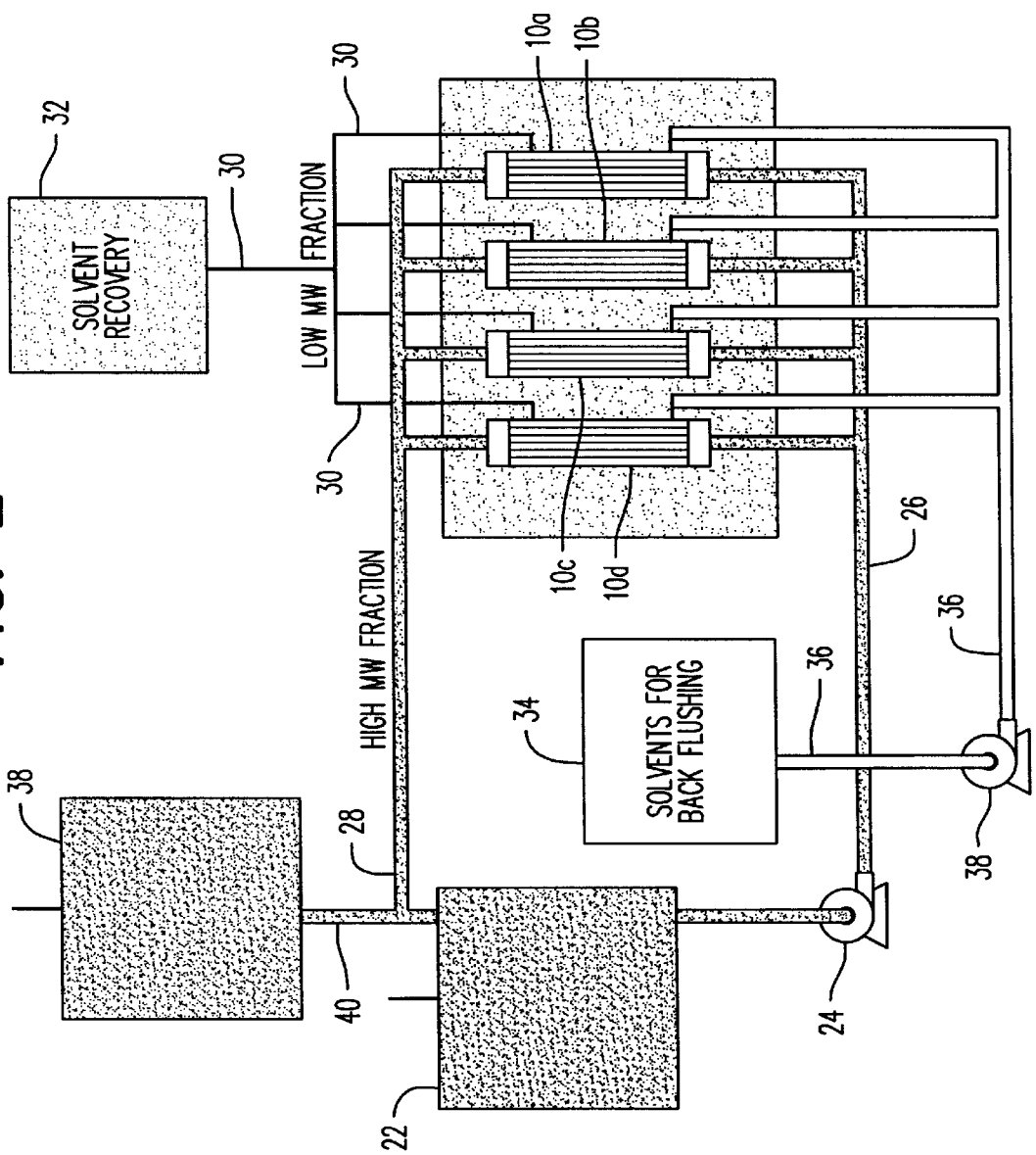
FIG. 2 is a preferred process flow diagram of the method of the invention.

A crude mixture of polymers may be passed through the fractionation apparatus a single time. However, for complete separations of the crude mixture, it is more desirable to pass the crude mixture over the fractionation apparatus multiple times, each pass removing more of the low molecular weight fraction. An array of more than one fractionation apparatus is also desirable to expedite the process and to handle the large volume of crude polymer solutions that are required in large scale manufacturing. FIG. 2 shows a process flow diagram of the method of the invention. As shown in FIG. 2, four fractionation apparatuses 10a, 10b, 10c, and 10d, each having the same MWCO, are arranged in parallel. A container 22 holds the crude polymer mixture made in a selected solvent as described above. A pump 24 pumps the solution of crude polymers through a feed line 26 and into the array of fractionation apparatuses 10a, 10b, 10c, and 10d. Retentate containing the high molecular weight fraction from the crude polymer solution is collected from the primary outlets of each fractionation apparatus in the array through feed line 28 and recirculated back into the container 22. The crude polymer solution may be passed through the array of fractionation apparatuses several times in order to separate substantially all of the polymer having molecular weight below the MWCO. The retentate solution containing high molecular weight fraction is transferred via pipe 40 and stored in a collection container 38a. The solvent may be stripped from the retentate solution and the high molecular weight polymer dissolved in an appropriate solvent, or the high molecular weight retentate solution may be used directly in the preparation of photoresists.

Permeate solution containing the low molecular weight fractions is collected from the respective secondary outlets on each fractionation apparatus through collection tubes 30 stored in a collection container 32. As described above, solvent may be stripped from the permeate solution and the low molecular weight polymer dissolved in an appropriate solvent, or the low molecular permeate solution may be used directly in the preparation of photoresists.

A solvent backflushing system may also be incorporated into the flow process to clean the debris or residue built up on the surface of the fractionation media. Solvent stored in a container 34 can be pumped by pump 38 into the fractionation apparatuses 10a, 10b, 10c, and 10d through tubes 36 to purge the system of polymers between batch runs.

Figure 3:
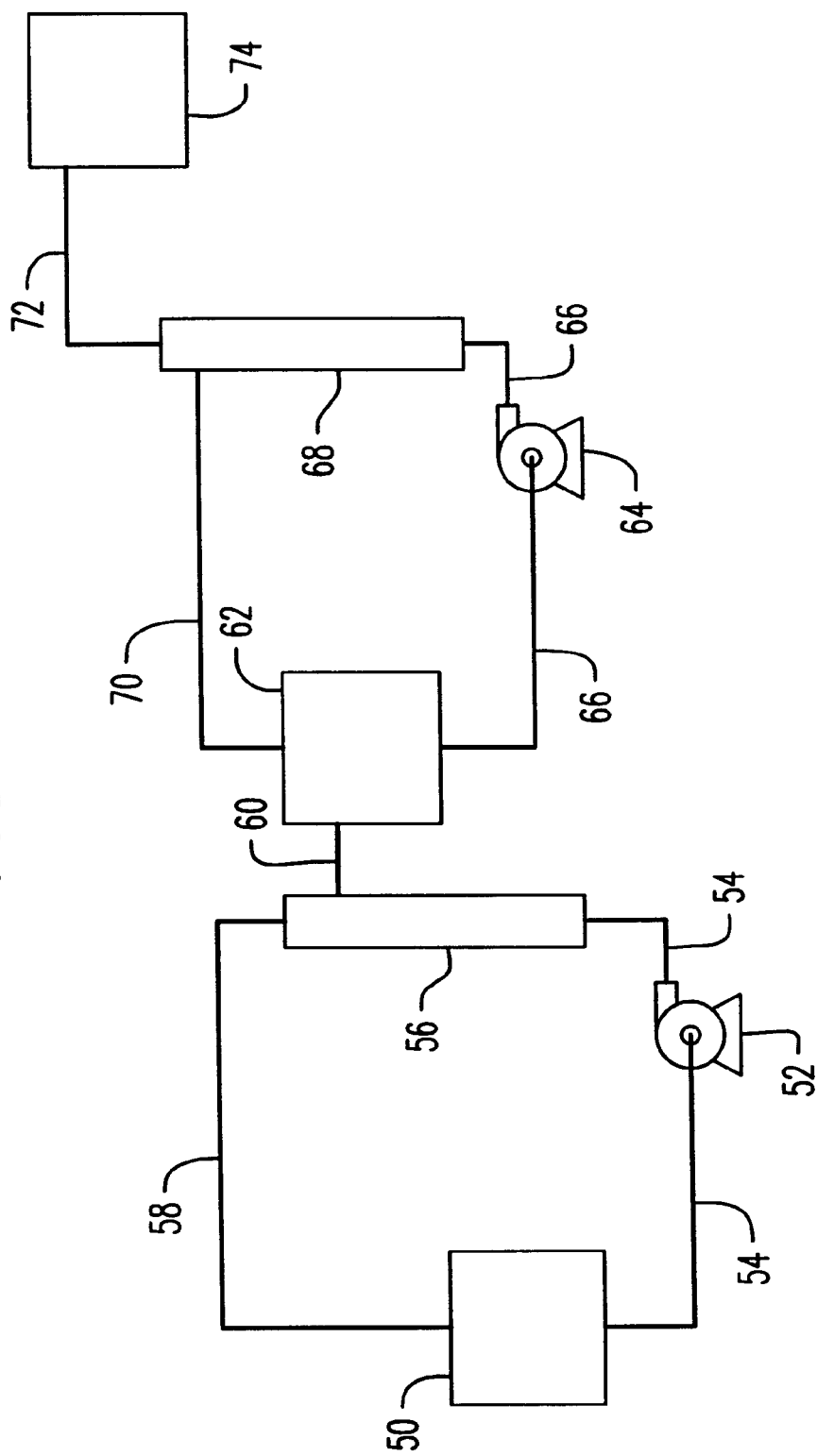
FIG. 3 is an alternative process flow diagram of the method of the invention.

In an alternative embodiment, two fractionation apparatuses containing porous polymeric media with different MWCOs may be arranged in series to isolate polymers having a specific range of molecular weights. In one alternative embodiment, shown in FIG. 3, a crude polymer mixture is held in a reservoir 50 and is pumped by a pump 52 through a first pipe 54 to a first fractionation apparatus 56 which includes a porous polymeric media having a selected MWCO. As the crude polymer passes through the first fractionation apparatus 56, the high molecular weight fraction contained in the retentate is recirculated back to the reservoir 50 through a second pipe 58. The low molecular weight fraction contained in the permeate, however, is transported through a third pipe 60 and into a second reservoir 62. The collected retentate is pumped by a second pump 64 through a fourth pipe 66 to a second fractionation apparatus 68 which includes a porous polymeric media having a selected MWCO that is less than the MWCO of the porous polymeric media in the first fractionation apparatus 56. As the collected permeate solution from the first fractionation apparatus passes through the second fractionation apparatus 68, the high molecular weight fraction contained in the retentate is recirculated back to the second reservoir 62 through a fifth pipe 70. The low molecular weight fraction contained in the permeate is transported through a sixth pipe 72 and collected in a collection reservoir 74. The polymers collected in the collection reservoir 62 have molecular weights in the range between the MWCOs of the porous polymeric media used in the first fractionation apparatus 56 and the second fractionation apparatus 68. These polymers may be stripped of solvent or used in photoresists directly, as indicated above.

Figure 4:
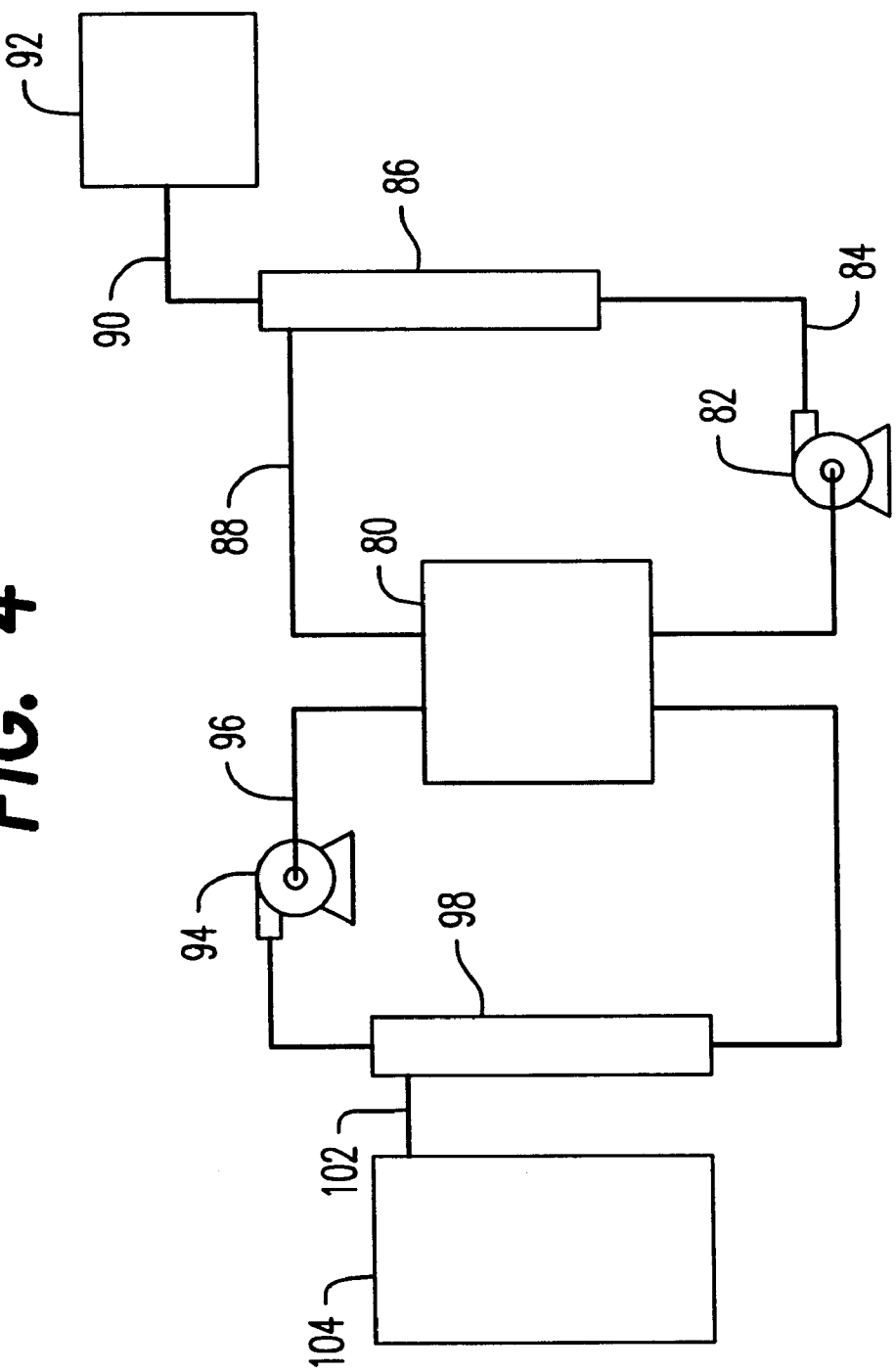
FIG. 4 is another alternative process flow diagram of the method of the invention.

In another alternative embodiment, illustrated in FIG. 4, a crude polymer mixture is held in a reservoir 80 and is pumped by a pump 82 through a first pipe 84 to a first fractionation apparatus 86 which includes a porous polymeric media having a selected MWCO. As the crude polymer passes through the first fractionation apparatus 86, the high molecular weight fraction contained in the retentate is recirculated back to the reservoir 80 through a second pipe 88. The low molecular weight fraction contained in the permeate, however, is transported through a third pipe 90 and into a second reservoir 92.

The collected retentate is pumped by a second pump 94 through a fourth pipe 96 to a second fractionation apparatus 98 which includes a porous polymeric media having a selected MWCO that is greater than the MWCO of the porous polymeric media in the first fractionation apparatus 86. As the collected retentate solution from the first fractionation apparatus passes through the second fractionation apparatus 98, the high molecular weight fraction contained in the retentate eluting from the second fractionation apparatus 98 is recirculated back to the reservoir 80 through a fifth pipe 100. The low molecular weight fraction eluting in the permeate is transported through a sixth pipe 102 and collected in a collection reservoir 104. The polymers collected in the collection reservoir 104 have molecular weights in the range between the MWCOs used in the first fractionation apparatus 86 and the second fractionation apparatus 98. These polymers may be stripped of solvent or used in photoresists directly, as indicated above.

Figure 5:
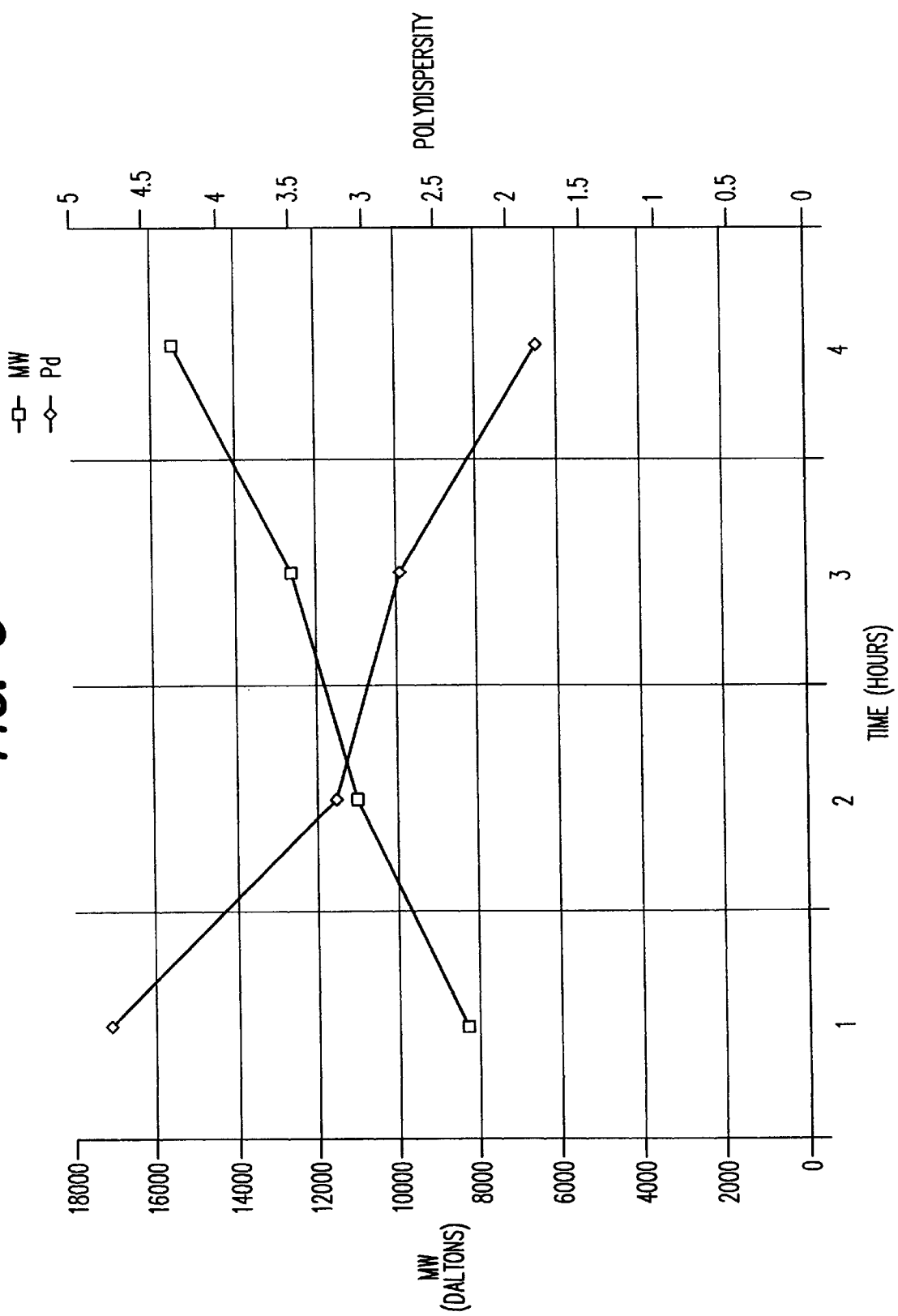
FIG. 5 is a graph showing the relationship between molecular weight and polydispersity in the retentate of the preferred fractionation apparatus of FIG. 1 as a function of separation time.

FIG. 5 is a graph showing the relationship between number average molecular weight (Mn) and polydispersity (Mw/Mn) of the polymer in the retentate flowing through the primary outlet 16 of FIG. 1 as a function of separation time. In FIG. 5, the same batch of crude polymer solution is passed through the fractionation apparatus for four hours, and samples from the retentate solution are taken and evaluated each hour with respect to polydispersity and number average molecular weight. As shown in FIG. 5, the number average molecular weight of the polymer in the crude mixture increases as the time spent in contact with the fractionation matrix increases. As a corollary, the polydispersity of the polymers decreases as more and more of low molecular weight fractions are removed as permeate with each pass.

Typically, the polymer solution flows through the fractionation apparatus at a rate that is commensurate with the scale of the fractionation and the volume of the fractionation apparatus. Generally, larger fractionation apparatuses can accommodate larger flow rates, while smaller fractionation apparatuses are useful for smaller scale. Useful flow rates for small scale preparations (e.g., 1000 ml or less) are from about 0.5 liter per hour to about 5 liters per hour. Larger scale fractionations may be conducted at higher flow rates, typically from about 100 liters per hour to 2000 liters per hour.

Figure 6A:
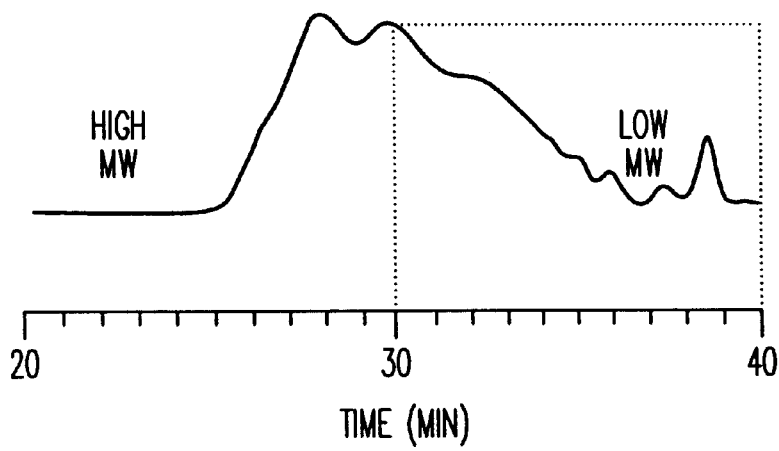
FIG. 6 are gel permeation chromatography (GPC) profiles of crude novolak polymer (A), retentate (B), and permeate (C)
Figure 6B:
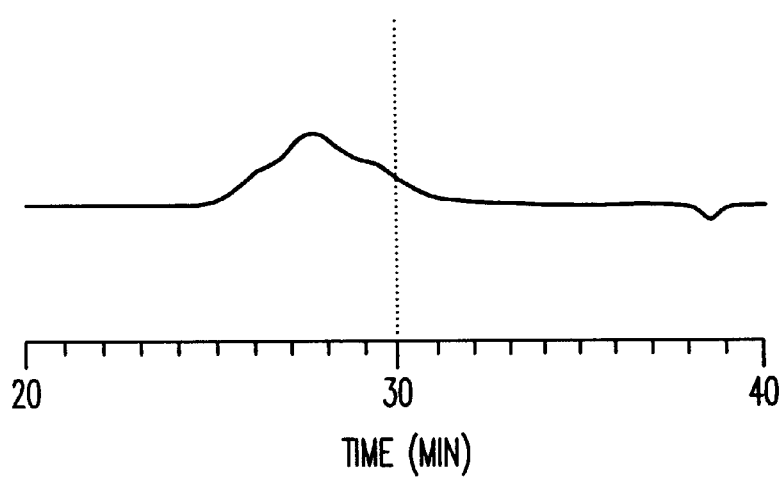
Figure 6C:
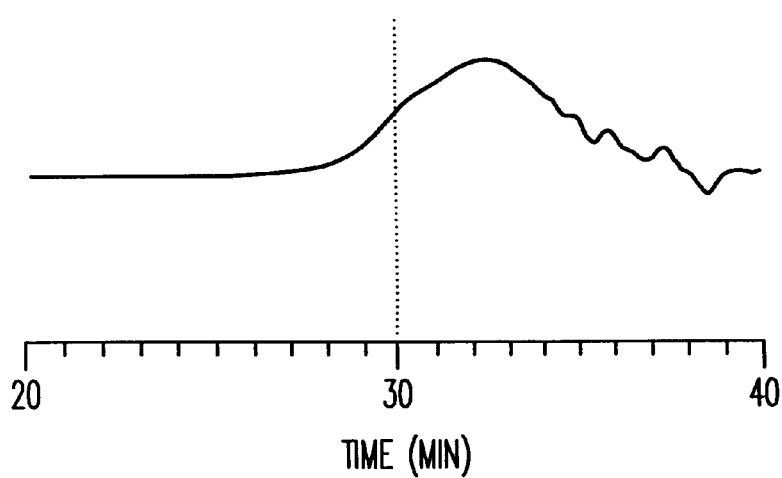

FIG. 6 shows gel permeation chromatography (GPC) profiles of a crude novolak polymer (A), the retentate (B), and the permeate (C) flowing from the fractionation apparatus. The original crude novolak polymer (A) (FIG. 6) has a weight average molecular weight of about 8203, a number average molecular weight of about 1730, and a polydispersity of 4.74. After passing the crude novolak polymer solution through a fractionation apparatus in accordance with the method of the invention, [i.e., a polyacrylonitrile, hollow fibrillar membrane with a MWCO of 3000 daltons; time of fractionation: 4 hours] the composition of the retentate and the permeate were evaluated by GPC. FIG. 6 shows GPC analysis of the retentate (B) containing high molecular weight polymers. The weight average molecular weight of the polymers in this fraction was about 15,500, the number average molecular weight was 8550, and the polydispersity was 1.82. FIG. 6 also shows GPC analysis of the permeate (C) containing low molecular weight polymers. The weight average molecular weight of the polymers in this fraction was about 2000, the number average molecular weight was about 950, and the polydispersity was about 2.15.

Figure 7A:
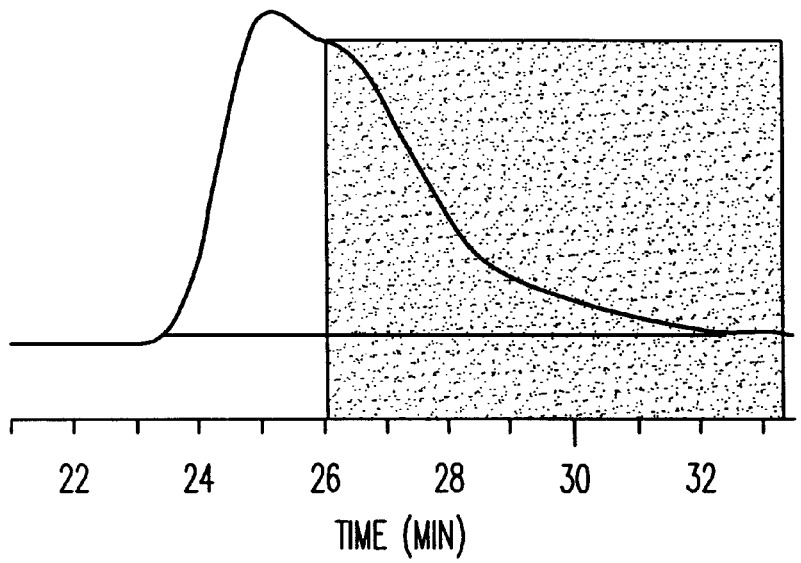
FIG. 7 are GPC profiles of a crude poly(hydroxystyrene-co-styrene) polymer (A) and the retentate flowing from the fractionation apparatus (B).
Figure 7B:
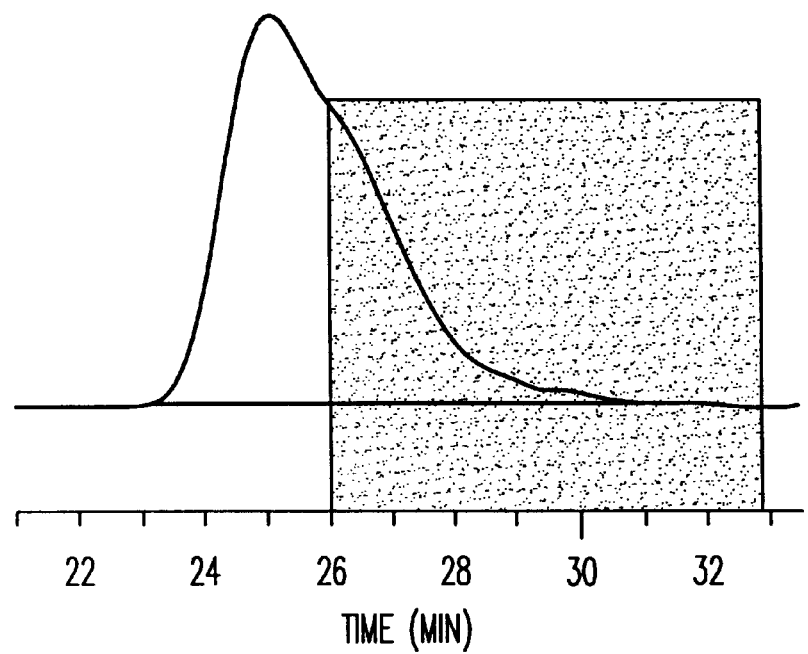

FIG. 7 shows GPC profiles of a crude poly(styrene-co-hydroxystyrene) polymer (A) and the retentate (B) flowing from the fractionation apparatus. The original polymer (A) (FIG. 7) has a weight average molecular weight of about 8325, a number average molecular weight of about 4000, and a polydispersity of 2.06. After passing the crude poly (hydroxystyrene-co-styrene) polymer solution through a fractionation apparatus in accordance with the method of the invention, [i.e., a polyacrylonitrile hollow fibrillar membrane with a MWCO of 3000 daltons; time of fractionation: 30 minutes], the composition of the retentate was evaluated by GPC. FIG. 7 shows GPC analysis of the retentate (B) containing high molecular weight polymers. The weight average molecular weight of the polymers in this fraction was about 10,800, the number average molecular weight was 7500, and the polydispersity was 1.45.

As indicated above, selected molecular weight fractions (either lower or higher) are added to a radiation-sensitive compound and at least one solvent to produce a radiation-sensitive composition.

One family of radiation-sensitive compounds that are useful to produce the above-noted radiation-sensitive composition includes photoactive compounds (known as PACs). Examples of PACs useful in the above-noted radiation-sensitive composition include naphthoquinonediazide (DNQ) esters derived from polyhydric phenols, alkyl-polyhydroxyphenones, aryl-polyhydroxyphenones and the like which can contain up to six or more sites for esterification. Examples of such photoactive compounds are shown in U.S. Pat. Nos. 4,957,846 (Jeffries et al.); 5,312,720 (Jeffries et al.); 5,376,497 (Kawata et al.); 5,429,904 (Nagase et al.); 5,456,995 (Ozaki et al.); 5,456,996 (Ozaki et al.); 5,468,590 (Hashimoto et al.); 5,501,936 (Hosoda et al.); 5,541,033 (Blakeney et al.); and 5,700,620 (Sakaguchi et al.). All of these U.S. patents are incorporated herein by reference in their entireties. The most preferred o-quinonediazide esters are derived from 3-diazo-3,4-dihydro-4-oxonapthalene sulfonic acid chloride or 6-diazo-5,6-dihydro-5-oxonaphthalane-1-sulfonic acid chloride. The term "photoactive compound" as used herein also includes naphthoquinonediazide (DNQ) esters of novolak resins ("capped novolaks") or similar resins where some of the hydroxy groups in the novolak or similar resins are replaced with a DNQ group.

If the radiation compound is one or more conventional photoactive compound, the proportion of the photoactive compound in the radiation-sensitive composition may preferably range from about 5 to 40%, more preferably from about 8 to about 30% by weight of the nonvolatile (e.g., nonsolvent) content of the radiation-sensitive composition. If the radiation compound is at least one capped novolak and at least one conventional photoactive compound, then the proportion of these radiation-sensitive compounds may preferably be from about 20% to 90% by weight of the nonvolatile (e.g., nonsolvent) compounds of the radiation-sensitive composition.

Another family of radiation-sensitive compounds includes photoacid-generating compounds (known as PAGs) which are useful in chemically-amplified photoresists absorbing in the deep UV range (192–248 nm). Examples of PAGs useful in the above-noted radiation-sensitive composition include onium salts, benzyl sulfonate esters, disulfones, iminosulfonates, and the like. Specific examples of photoacid-generating compounds include, but are not limited to, triarylsulfonium compounds; alkylarylsulfonium compounds; trialkylsulfonium compounds; diaryliodonium compounds; benzylsulfonate ester compounds; disulfone compounds; and iminosulfonate compounds. Suitable counterions for the above-noted PAGs include $SbF_6^-$, $PF_6^-$, $AsF_6^-$, $BF_4^-$, triflate ($CF_3SO_3^-$), alkyl sulfonate, dodecylbenzenesulfonate, camphorsulfonate, cyclohexylsulfonate, nitrobenzenesulfonate, and the like.

If the radiation-sensitive composition is a chemically amplified photoresist and the radiation-sensitive compound is one or more photoacid generators, the preferred percentage of total photoacid generator compounds may be from about 0.5% to about 10% by weight of the solids portion (i.e., nonsolvents) of the chemically amplified photoresist.

The solvents included in the radiation-sensitive composition of the present invention are used to dissolve the radiation-sensitive compound and the fractionated polymer or polymers and optional additives. Useful solvents include, but are not limited to, ethyleneglycol monomethyl ether, ethyleneglycol monoethyl ether, ethyleneglycol monoethyl ether acetate, propyleneglycol methyl ether acetate, propyleneglycol propyl ether acetate, methylbenzene, dimethylbenzene, methylethyl ketone, cyclohexanone, ethyl-2-hydroxypropionate, ethyl-2-hydroxy-2-methyl propionate, ethyl hydroxyacetate, 2-hydroxy-3-methyl butanoate, methyl-3-methoxy propionate, ethyl-3-methoxy propionate, ethyl-3-ethoxy propionate, methyl-3-ethoxy propionate, methyl pyruvate, ethyl pyruvate, butyl acetate, ethyl lactate, and propyleneglycol monomethyl ether propionate. These organic solvents may be used either individually or in combination. A high boiling point solvent such as N-methylformamide, N,N-dimethylformamide, N-methylacetamide, N-dimethylacetamide, N-methyl-2-pyrrolidone, dimethylsulfoxide, or benzylethyl ester may be used in the above-mentioned solvents either individually or in combination and at various ratios.

Additional ingredients such as speed enhancers, anti-striation or leveling agents, plasticizers, crosslinking agents, surfactants, adhesion promoters, and the like may also be added to the radiation-sensitive composition of the invention. Preferably, the amounts of these additional ingredients range individually from about 0.1 to about 5 wt %, based on the total weight of the composition.

The prepared radiation-sensitive composition can be applied to a substrate by any conventional method used in the photoresist art, including dipping, spraying, whirling and spin coating. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures. The photoresist coatings produced by the above described procedure are particularly suitable for application to silicon wafers coated with a silicon dioxide or silicon nitride layer.

After the resist solution is coated onto the substrate, the coated substrate is baked at approximately 70° C. to 125° C. until substantially all the solvent has evaporated and only a uniform radiation-sensitive coating remains on the substrate. The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light is the preferred source of radiation, other sources of radiation such as visible light, electron or ion-beam and X-ray radiant energy may be used instead.

The exposed resist-coated substrates are preferably subjected to a post exposure bake at a temperature from about 100° C. to about 130° C. for about 30–300 seconds to enhance image quality and resolution. The exposed resist-coated substrates are next developed in an aqueous alkaline solution, such as aqueous solutions of tetramethyl-ammonium hydroxide, sodium hydroxide, potassium hydroxide, and the like. The substrates are allowed to remain in the developer until all of the resist coating has dissolved from the exposed areas (generally from about 10 seconds to about 3 minutes).

After selective dissolution of the coated wafers in the developing solution, they are preferably subjected to a deionized water rinse to fully remove the developer or any remaining undesired portions of the coating and to stop further development. A post-development heat treatment or bake may then be employed to increase the coating's adhesion and chemical resistance to etching solutions and other substances.

In industrial applications, particularly in the manufacture of microcircuitry units on silicon/silicon dioxide-type substrates, the developed substrates may then be treated with a buffered hydrofluoric acid etching solution or plasma gas etch. The remaining areas of the photoresist coating may be removed from the etched substrate surface by conventional photoresist stripping operations.

The present invention is further described in detail by means of the following examples and comparison examples. However, this invention is not intended to be limited by these examples and comparisons. All parts and percentages are shown by weight percent, and all temperatures are in degrees Celsius, unless explicitly stated otherwise. All patents, patent applications, and other publication are herein incorporated by reference in their entireties.

EXAMPLES

Example 1

Fractionation of a Novolak Resin 10 g of a m-cresol, p-cresol and 2,5-dimethylphenol-based novolak was dissolved in 100 mL of ethanol. The solution was pumped through SEP00013™ M membrane module (Pall Corporation, East Hills, N.Y.) having a molecular weight cut off (MWCO) of 3000 daltons. Table 1 shows the molecular weight profiles of the original novolak and the fractionated novolak:

TABLE 1

| Molecular Weight Profile of Original Novolak | Molecular Weight Profile of Fractionated Novolak (High MW Fraction) | Molecular Weight Profile of Fractionated Novolak (Low MW Fraction) |
| --- | --- | --- |
| Mw: 8203 | Mw: 15,562 | Mw: 2051 |
| Mn: 1732 | Mn: 8556 | Mn: 953 |
| PD: 4.763 | PD: 1.82 | PD: 2.15 |

Example 2

Fractionation of Polyhydroxystyrene 10 g of polyhydroxy styrene (PHS) was dissolved in 100 mL of ethanol. The solution was circulated through a SEP00013™ membrane module (Pall Corporation, East Hills, N.Y.) having a molecular weight cut off (MWCO) limit of 3000 daltons. Table 2 shows the molecular weight profiles of the original polymer, the high molecular weight fractionated polymer and the low molecular weight fraction:

TABLE 2

| Molecular Weight Profile of Original PHS | Molecular Weight Profile of Fractionated PHS (High MW Fraction) | Molecular Weight Profile of Fractionated PHS |
| --- | --- | --- |
| Mw: 7700 | Mw: 7996 | Mw: 2051 |
| Mn: 3893 | Mn: 5667 | Mn: 953 |
| PD: 1.98 | PD: 1.41 | PD: 2.15 |

Example 3

Fractionation of Copolymer of Hydroxystyrene and Styrene 30 g of the copolymer of hydroxy styrene and styrene (HSSCP) was dissolved in 300 mL of ethanol. The solution was circulated through a SEP00013™ membrane module (Pall Corporation, East Hills, N.Y.) having a molecular weight cut off (MWCO) limit of 3000 daltons. Table 3 shows the molecular weight profiles of the original polymer, the high molecular weight fractionated polymer and the low molecular weight fraction:

TABLE 3

| Molecular Weight Profile of Original HSSCP | Molecular Weight Profile of Fractionated HSSCP (High MW Fraction) | Molecular Weight Profile of Fractionated HSSCP (Low MW Fraction) |
| --- | --- | --- |
| Mw: 8325 | Mw: 10,843 | Mw: 6087 |
| Mn: 4037 | Mn: 7496 | Mn: 3001 |
| PD: 2.06 | PD: 1.45 | PD: 2.03 |

Examples 4–5 and Comparison Example 1

Lithographic Evaluation of the High Molecular Weight Fractionated Novolak (FN) of Example 1

A. Preparation of Novolak Solution:

The high molecular weight fraction (FN) made in Example 1 is obtained as ethanol solution. Ethanol from that FN novolak solution is removed by vacuum distillation at 45° C., and the resulting novolak residue thus obtained is dried in vacuum oven at 45° C. for 12 hours. The dried fractionated novolak is dissolved in a mixture of methyl-3-methoxy propionate (MMP) and ethyl-3-ethoxypropionate (EEP).

B. Preparation of Photoresists:

Three resist components were blended in amber-colored glass bottles. The order of addition of resist components was (1) novolak solution, (2) photoactive compound (PAC), and (3) leveling agent. All components were weighed on an electronic balance having an accuracy to ±0.01 grams. A leveling agent (FLUORAD FC-430; fluoroaliphatic polymer esters) was added at a concentration of 0.03% by weight of the resist sample. When all the components had dissolved, the resist samples were microfiltered directly into clean bottles. These formulations are summarized in Table 4.

TABLE 4

| Example | Novolak Type | DNQ Contribution | Speed Enhancer | Solvent |
| --- | --- | --- | --- | --- |
| C-1 | N1 (1.207 g) | PAC 1 (0.5943 g) PAC 2 (0.1698 g) Capped Novolak (3.08 g) | TRISP.PA (0.46 g) | EEP: (5.0 g) MMP (5.0 g) |
| 4 | N1: (0.6 g) FN: (0.6 g) (Example 1) | SAME AS IN EXAMPLE 4 | | |
| 5 | FN (1.2 g) (Example 1) | SAME AS IN EXAMPLE 4 | | |

Novolak N1 is a condensation product of 2,2'-dihydroxy-5,5'-dimethyl-diphenylmethane, o-cresol, 2,3-dimethyl phenol, 2,6-diethyl phenol and 2,3,5-trimethyl phenol with formaldehyde. The detailed synthetic procedure is provided in U.S. Pat. No. 5,346,808. The speed enhancer TRISP-PA (CAS No. 110728-28-8) is 1-[1'-methyl-1'-(4'-hydroxyphenyl)ethyl]4-[1',1'-bis-(4-hydroxyphenyl)ethyl]benzene.

PAC1 is a mixture of o-quinonediazidesulfonyl esters of a polyhydroxy aromatic compound represented by the following structure:

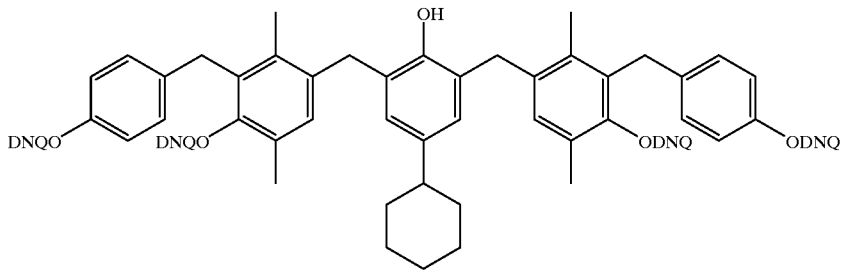

The nominal esterification level of PAC1 is 2.5 molar equivalent. The synthesis procedure of this PAC is described in U.S. Pat. No. 5,67,932.

PAC2 is a mixture of o-quinonediazidesulfonyl esters of a polyhydroxy aromatic compound represented by the following structure:

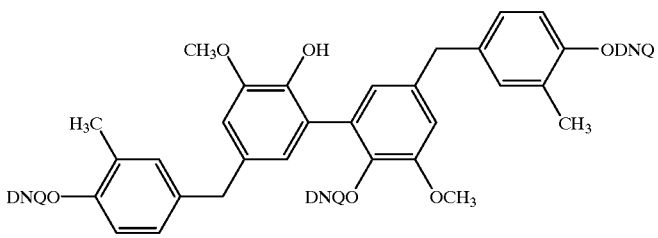

The nominal esterification level of PAC2 is 2.5 molar equivalent. The synthesis procedure of this PAC is described in U.S. Pat. No. 5,602,260.

DNQ-Novolak (Capped Novolak) is an o-quinonediazide-sulfonate ester of a novolak. DNQ Novolak was synthesized using the following procedure: Into a 1000 mL round-bottom flask was charged 100 g of a 2,5-xylenol-based novolak. This novolak has a weight average molecular weight of 3119 daltons and a Tc (time to dissolve 1 μm thick film) of 13 seconds. 300 g of acetone was charged and the mixture was stirred. 17.61 g of o-quinonediazide sulfonyl chloride dissolved in 25 mL of acetone was charged. 8.97 g of triethylamine was added via an addition funnel over a period of 15 minutes. The mixture was allowed to stir for 1.5 hours. 5.14 g of oxalic acid was charged and the mixture was agitated for 15 minutes. The solution was precipitated by addition in 5 L of deionized (DI) water. The precipitated product was isolated by filtration and washed twice with 2 L of DI water. The product was dried in a vacuum oven at 45° C. for several hours. The esterified novolak thus generated was found to have 8.9% of o-quinonediazide-5-sulfonyl ester content.

C. Coating, Softbaking, Exposure, Post-Exposure Baking, and Developing of the Photoresists:

The following general procedure was followed for the development of a positive tone image:

The wafers were spin-coated by applying 3 mL of photoresist formulations shown in Table 4 to the static four-inch wafers. The wafer was then spun to give a uniform film thickness of around 1.1 micron. These photoresist coated wafers were then softbaked at 90° C. for 60 seconds to remove the residual solvents. The softbaked photoresist-coated wafers were then exposed on an i-line stepper for lithographic evaluation. After completion of exposure, the wafers were subjected to a post-exposure bake (PEB) by heating at 120° C. for 60 seconds. Following the PEB, the wafers were puddle or spray-developed using a 0.262 N tetramethylammonium hydroxide, aqueous developer for 60 seconds. A deionized water rinse was applied for 20 seconds while spinning, followed by dry nitrogen gas to dry the wafer.

Each imaged photoresist-coated substrate was evaluated for several important properties, such as exposure threshold ($E_o$), optimum photospeed ($E_{opt}$), exposure margin (EM or $E_{opt}/E_o$), equal line/space pair resolution (res.) and depth of focus (DOF) for both profile and critical dimensions.

D. Photoresist Evaluations:

The lithographic properties of the photoresist formulations (Table 4) are provided in Table 5:

TABLE 5

| Example | $E_O$ | $E_{opt}$ | EM | Res. (μm) | DOF (profile) | DOF (CD) |
|---------|-------|-----------|------|-----------|---------------|----------|
| C1      | 92    | 225       | 2.45 | 0.295     | 1.2           | 1.4      |
| 4       | 115   | 260       | 2.26 | 0.29      | 1.3           | 1.8      |
| 5       | 145   | 300       | 2.07 | 0.3       | 1.1           | 1.6      |

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed:

1. A process for preparing a radiation-sensitive composition, comprising the steps of:
   (1) passing a solution of a crude polymer comprising a mixture of polymer chains having different molecular weights through at least one porous polymeric media having a molecular weight cut-off (MWCO) value, thereby separating said crude polymeric mixture into a first fraction comprising polymer chains having molecular weights above said MWCO value and a second fraction comprising polymer chains having molecular weights below said MWCO value; and (2) adding at least one fraction produced in the first step to at least one radiation-sensitive compound and at least one solvent to produce a radiation-sensitive composition.

2. The process of claim 1, wherein said polymer chains in said crude polymer mixture are selected from the group consisting of novolaks, polymers of hydroxystyrene, copolymers of hydroxystyrene, polymers of partially or fully protected hydroxystyrene, or copolymers of partially or fully protected hydroxystyrene.

3. The process of claim 1, wherein the solvent for the crude polymer is selected from the group consisting of aliphatic alcohols, ketones, aldehydes, ethers and esters, and combinations thereof.

4. The process of claim 1, wherein said radiation-sensitive compound is at least one photoactive compound.

5. The process of claim 1, wherein said radiation-sensitive compound is at least one photoacid generator and said radiation-sensitive composition is a chemically amplified photoresist.

6. The process of claim 1, wherein said molecular weight cut-off (MWCO) value is 10,000 daltons.

7. The process of claim 1, wherein said molecular weight cut-off (MWCO) value is 6,000 daltons.

8. The process of claim 1, wherein said molecular weight cut-off (MWCO) value is 3,000 daltons.

9. A radiation-sensitive composition, comprising:
   (a) at least one solvent;
   (b) at least one radiation-sensitive compound; and
   (c) at least one said polymer fraction produced by the process of claim 1.

10. The radiation-sensitive composition of claim 9, wherein said binder resin is selected from the group consisting of novolaks, polymers of hydroxystyrene, copolymers of hydroxystyrene, polymers of partially or fully protected hydroxystyrene, or copolymers of partially or fully protected hydroxystyrene.

11. The radiation-sensitive composition of claim 9, wherein said at least one solvent is selected from the group consisting of ethyl lactate, ethyl 3-ethoxypropionate, methyl 3-methoxypropionate, propylene glycol methyl ether acetate, and combinations thereof.

12. The radiation-sensitive composition of claim 9, wherein said radiation-sensitive compound is at least one photoactive compound.

13. The radiation-sensitive composition of claim 9, wherein said radiation-sensitive compound is at least one photoacid generator.

14. A process for preparing a radiation-sensitive composition, comprising the steps of:
   (1) passing a solution of a crude polymer mixture comprising a mixture of polymer chains having different molecular weights through a first porous polymeric media having a molecular weight cut-off (MWCO) value, thereby separating said crude polymeric mixture into a first fraction comprising polymer chains having molecular weights greater than said MWCO value and a second fraction comprising polymer chains having molecular weights less than said MWCO value;
   (2) passing said second fraction through a second porous polymeric media, said second porous polymeric media having a predetermined MWCO value that is less than said MWCO value of said first porous polymeric media, thereby separating said second fraction into a third fraction comprising polymer chains having molecular weights between said MWCO values, and a fourth fraction comprising polymer chains having molecular weights less than said MWCO value of said second polymeric media; and
   (3) adding said third fraction to at least one radiation-sensitive compound and at least one solvent to produce a radiation-sensitive composition.

15. The process of claim 14, wherein said MWCO of said first orous polymeric media is 6000 daltons, and said MWCO of said second porous polymeric media is 3000 daltons.

16. A radiation-sensitive composition comprising:
   (a) at least one solvent;
   (b) at least one radiation-sensitive compound; and
   (c) at least one polymer fraction produced by the process of claim 14.

17. A process for preparing a radiation-sensitive composition, comprising the steps of:
   (1) passing a solution of a crude polymer mixture comprising a mixture of polymer chains having different molecular weights through a first porous polymeric media having a molecular weight cut-off (MWCO) value, thereby separating said crude polymeric mixture into a first fraction comprising polymer chains having molecular weights greater than said first MWCO value and a second fraction comprising polymer chains having molecular weights less than said MWCO value;
   (2) passing said first fraction through a second porous polymeric media, said second porous polymeric media having a predetermined MWCO value that is greater than said MWCO value of said first porous polymeric media, thereby separating said first fraction into a third fraction comprising polymer chains having molecular weights greater than said MWCO value of said second polymeric media, and a fourth fraction comprising polymer chains having molecular weights between said MWCO values; and
   (3) adding said fourth fraction to at least one radiation-sensitive compound and at least one solvent to produce a radiation-sensitive composition.

18. The process of claim 17, wherein said MWCO of said first porous polymeric media is about 6000 daltons, and said MWCO of said second porous polymeric media is about 10,000 daltons.

19. A radiation-sensitive composition comprising:
   (a) at least one solvent;
   (b) at least one radiation-sensitive compound; and
   (c) at least one polymer fraction produced by the process of claim 17.

20. The process of claim 1, wherein said polymer chains in said crude polymer mixture are selected from the group consisting of copolymers with repeating units of hydroxystyrene, partially protected hydroxystyrene or fully protected hydroxystyrene with methacrylate or acrylate repeating units.

21. The radiation-sensitive composition of claim 9, wherein said binder resin is selected from the group consisting of copolymers with repeating units of hydroxystyrene, partially protected hydroxystyrene or fully protected hydroxystyrene with methacrylate or acrylate repeating units.

* * * * *